US012666966B2

(12) United States Patent
Nakamura et al.

(10) Patent No.: US 12,666,966 B2
(45) Date of Patent: Jun. 23, 2026

(54) SEMICONDUCTOR DEVICE

(71) Applicant: Mitsubishi Electric Corporation, Tokyo (JP)

(72) Inventors: Hiroyuki Nakamura, Tokyo (JP); Shiori Uota, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 380 days.

(21) Appl. No.: 18/353,669

(22) Filed: Jul. 17, 2023

(65) Prior Publication Data

US 2024/0096743 A1 Mar. 21, 2024

(30) Foreign Application Priority Data

Sep. 21, 2022 (JP) ................................ 2022-150037

(51) Int. Cl.
*H10W 40/77* (2026.01)
*H10W 70/40* (2026.01)
*H10W 74/10* (2026.01)

(52) U.S. Cl.
CPC ........ *H10W 40/778* (2026.01); *H10W 74/111* (2026.01)

(58) Field of Classification Search
CPC ......... H01L 23/4334; H01L 23/49568; H10W 40/778; H10W 74/111; H10W 74/127; H10W 70/481; H10W 70/465
See application file for complete search history.

(56) References Cited

U.S. PATENT DOCUMENTS

| | | | | | |
|---|---|---|---|---|---|
| 5,258,649 | A | * | 11/1993 | Tanaka | ................... H05K 3/325 |
| | | | | | 257/796 |
| 5,986,336 | A | * | 11/1999 | Tomita | .............. H01L 23/49568 |
| | | | | | 257/796 |
| 2013/0062745 | A1 | | 3/2013 | Kimura | |
| 2015/0102474 | A1 | | 4/2015 | Kimura | |
| 2016/0141224 | A1 | * | 5/2016 | Yoshihara | ............... H01L 23/28 |
| | | | | | 257/676 |
| 2017/0005031 | A1 | | 1/2017 | Kimura | |

(Continued)

FOREIGN PATENT DOCUMENTS

| | | | |
|---|---|---|---|
| JP | 2011-134949 A | 7/2011 | |
| JP | 2013-070026 A | 4/2013 | |

(Continued)

OTHER PUBLICATIONS

An Office Action; "Notice of Reasons for Refusal," mailed by the Japanese Patent Office on Apr. 22, 2025, which corresponds to Japanese Patent Application No. 2022-150037 and is related to U.S. Appl. No. 18/353,669; with English language translation.

*Primary Examiner* — Monica D Harrison
*Assistant Examiner* — Jacob T Nelson
(74) *Attorney, Agent, or Firm* — Studebaker Brackett PLLC

(57) ABSTRACT
A power module includes a conductive die bonding portion, a semiconductor element bonded to an upper surface of the die bonding portion, a sealing member sealing the die bonding portion and the semiconductor element, and a flexible insulating member bonded to a lower surface of the die bonding portion. The flexible insulating member is arranged in a recessed portion on a lower surface of the sealing member and has a convex portion protruding from the lower surface of the sealing member.

6 Claims, 4 Drawing Sheets

10

(56)          References Cited

U.S. PATENT DOCUMENTS

| 2018/0130724 A1 | 5/2018 | Kimura |
| 2019/0080990 A1 | 3/2019 | Kimura |
| 2021/0175150 A1* | 6/2021 | Ichinohe ................. H01L 23/28 |

FOREIGN PATENT DOCUMENTS

| JP | 2013-258354 A | 12/2013 |
| JP | 2015-023212 A | 2/2015 |

* cited by examiner

F I G .  1
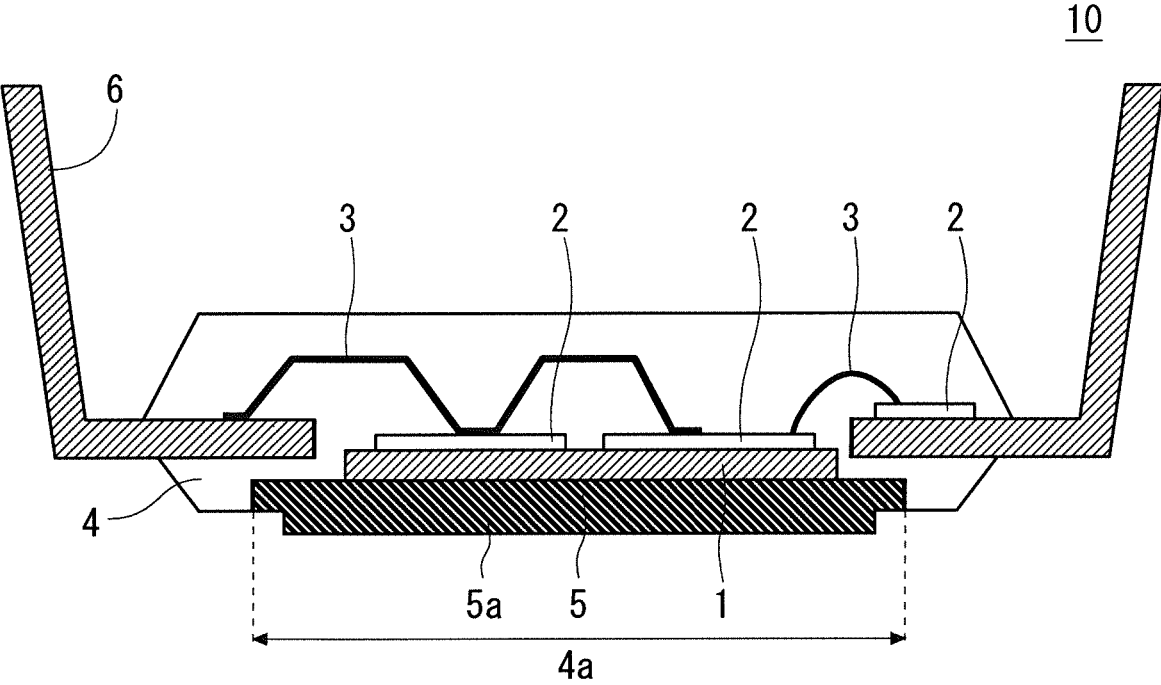

F I G. 3
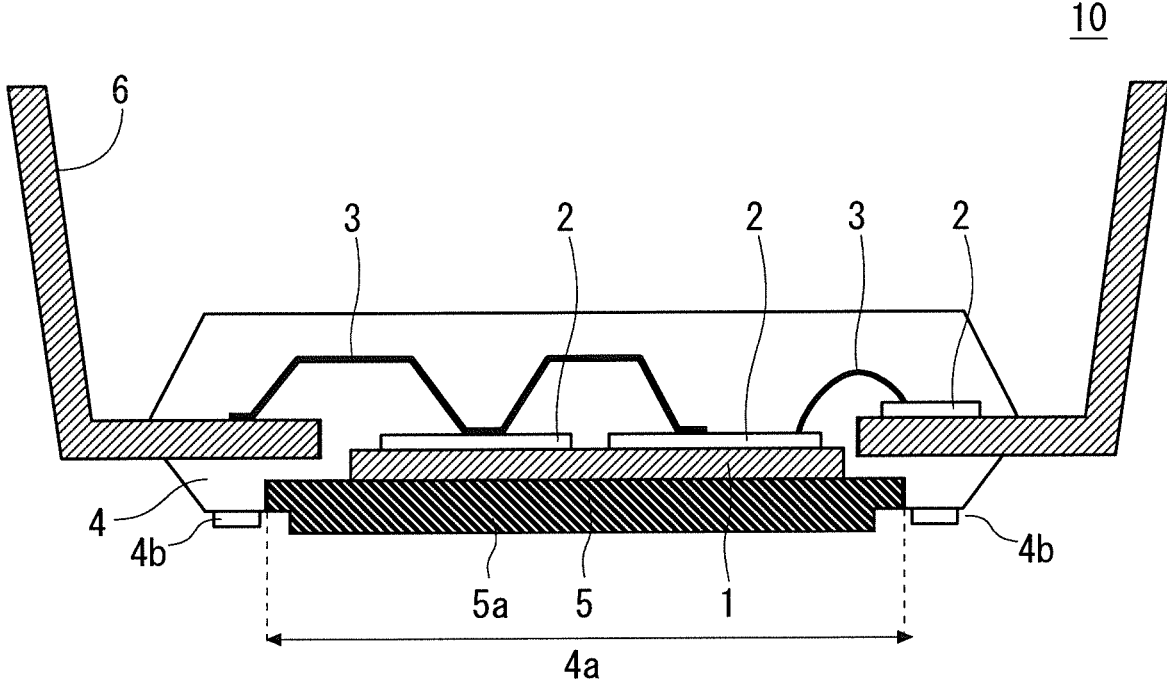

F I G.  4
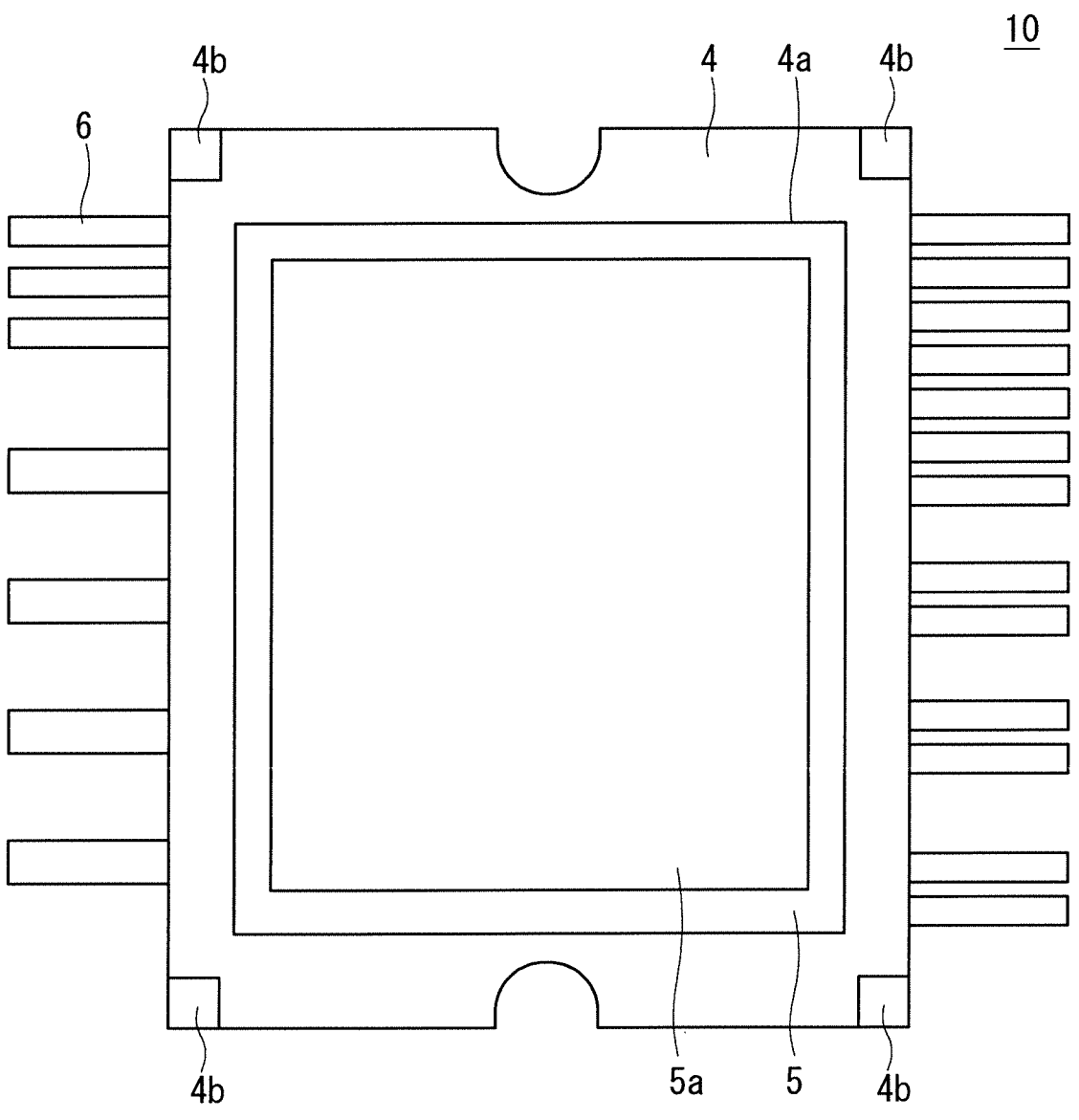

SEMICONDUCTOR DEVICE

BACKGROUND OF THE INVENTION

Field of the Invention

The present disclosure relates to a semiconductor device, and more particularly to a semiconductor device having an insulating member made of a flexible insulating material.

Description of the Background Art

Conventionally, materials with poor flexibility are used for insulating members used in semiconductor devices as power modules. Therefore, when attaching the insulating member of the power module to a cooler such as a heat sink, the thermal compound is applied to one or both of the cooler and the insulating member of the power module to fill gaps between the cooler and the insulating member of the power module which are caused due to irregularities and warping thereof. However, this is a cause of inhibition of the cooling effect of the cooler because the thermal resistance of the thermal compound is higher than that of the cooler.

As a technique to solve this problem, Japanese Patent Application Laid-Open No. 2015-23212 below discloses a technique in which the formation of gaps between the cooler and the insulating member is prevented without using a thermal compound by applying an insulating member made of a flexible insulating material (hereinafter referred to as "flexible insulating member") to a power module.

SUMMARY

In the power module disclosed in Japanese Patent Application Laid-Open No. 2015-23212, a flexible insulating member is provided on the heat dissipation surface of the power module (that is, the surface attached to the cooler) so as to protrude from a sealing member made entirely of a mold resin. Therefore, when a power module using a mold resin is molded, the mold resin tends to enter underneath the end portion of the flexible insulating member, and resin burrs are likely to occur in the portion. The resin burrs in the sealing member deteriorate the adhesion between the power module and the cooler, inhibiting the cooling effect thereof, or cause breaking down of the insulating member, reducing insulation property thereof.

A semiconductor device including a flexible insulating member on a heat dissipation surface, resin burrs entering underneath the flexible insulating member are prevented from generating.

A semiconductor device according to the present disclosure includes a conductive die bonding portion, a semiconductor element bonded to an upper surface of the die bonding portion, a sealing member sealing the die bonding portion and the semiconductor element, and a flexible insulating member bonded to a lower surface of the die bonding portion. The flexible insulating member is arranged in a recessed portion on a lower surface of the sealing member and has a convex portion protruding from the lower surface of the sealing member.

According to the semiconductor device of the present disclosure, the flexible insulating member is arranged in a recessed portion on a lower surface of the sealing member and has a convex portion protruding from the lower surface of the sealing member; therefore, the mold resin is suppressed from entering underneath the end portion of the flexible insulating member during molding of the semiconductor device, preventing the occurrence of resin burrs in the sealing member.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a cross-sectional view of a power module according to Embodiment 1;

FIG. 3 is a cross-sectional view of a power module according to Embodiment 2; and FIG. 4 is a plan view of the lower surface side of the power module according to Embodiment 2.

DESCRIPTION OF THE PREFERRED EMBODIMENTS

Embodiment 1

Figure 2:
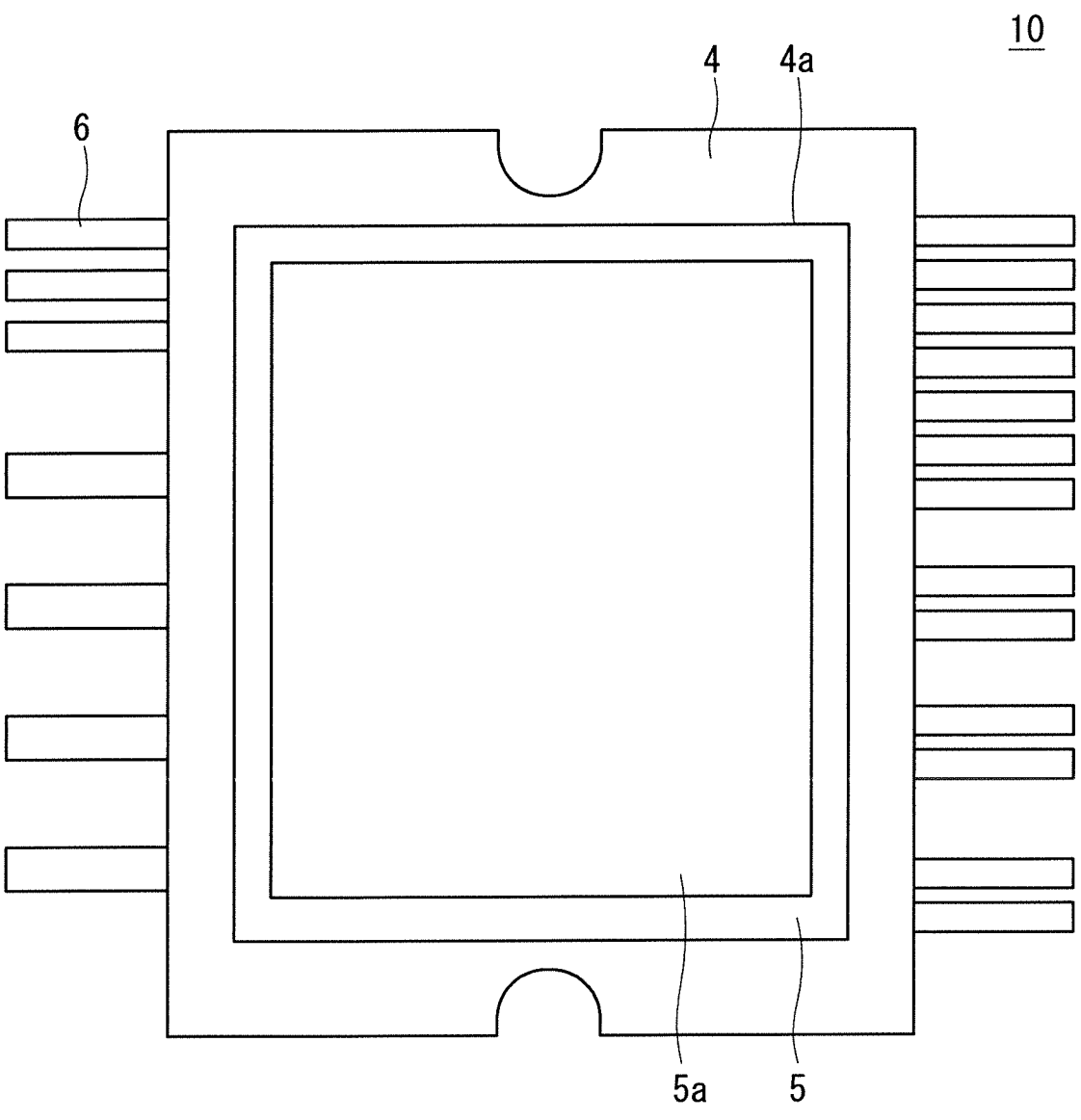
FIG. 2 is a plan view of the lower surface side of the power module according to Embodiment 1.

FIGS. 1 and 2 are diagrams showing a configuration of a power module 10 being a semiconductor device according to Embodiment 1. FIG. 1 is a cross-sectional view of the power module 10, and FIG. 2 is a plan view of the lower surface side of the power module 10. Although the upper side of the element shown in FIG. 1 is referred to as "the upper surface", the lower side thereof is referred to as "the lower surface" for convenience of explanation, the terms do not indicate the direction in which each surface faces when the power module 10 is actually used.

The power module 10 includes a conductive frame including a die bonding portion 1 and a terminal portion 6, semiconductor elements 2 bonded to the upper surface of the die bonding portion 1, and wiring 3 connecting the semiconductor elements 2 to the terminal portion 6. The die bonding portion 1, the semiconductor elements 2, the wiring 3 and the terminal portion 6 are sealed with a sealing member 4 made of a mold resin. However, part of the terminal portion 6 protrudes from the sealing member 4 so as to be connectable with the outside. Also a flexible insulating member 5 made of a flexible insulating material is bonded to the lower surface of the die bonding portion 1. The hardness of the flexible insulating member 5 is assumed to be lower than that of the sealing member 4. Here, the upper surface of the sealing member 4 is defined as the "first main surface" and the lower surface as the "second main surface".

A recessed portion 4a is provided on the second main surface of the sealing member 4, and the flexible insulating member 5 is arranged in the recessed portion 4a. Further, the lower surface of the flexible insulating member 5 is provided with a convex portion 5a that protrudes from the second main surface of the sealing member 4. That is, as shown in FIG. 1, the upper portion of the flexible insulating member 5 is embedded inside the recessed portion 4a of the sealing member 4, and the lower portion of the flexible insulating member 5 protrudes from the sealing member 4. Therefore, the lower surface of the sealing member 4 is positioned between the upper surface and the lower surface of the flexible insulating member 5 in cross-sectional view.

When the power module 10 is actually used, the flexible insulating member 5 is attached to an unillustrated cooler such as a heat sink. Accordingly, the lower surface of the flexible insulating member 5 serves as a heat dissipation surface of the power module 10.

When the power module 10 operates, the semiconductor elements 2 generate heat. Heat dissipation routes of the heat generated in the semiconductor elements 2 include a heat dissipation route from the semiconductor element 2 to the terminal portion 6 through the wiring 3, a heat dissipation route from the semiconductor elements 2 to the air through the sealing member 4, and a heat dissipation route from the semiconductor elements 2 to the cooler through the flexible insulating member 5. Among these, the route with the larger amount of heat dissipation is the heat dissipation route to the cooler.

According to the power module 10 according to Embodiment 1, the flexible insulating member 5 provided on the heat dissipation surface is made of a flexible material; therefore, the formation of gaps between the cooler and the flexible insulating member 5 is prevented without using a thermal compound, when attaching the power module 10 to the cooler. Elimination of the thermal compound enables to reduce the number of assembly steps of a system incorporating the power module 10, contributing to cost reduction.

In addition, the flexible insulating member 5 is arranged in the recessed portion 4a on the lower surface of the sealing member 4, and the sealing member 4 has the convex portion 5a protruding from the second main surface; therefore, the molding resin is suppressed from entering underneath the end portion of the flexible insulating member when the power module 10 using the molding resin is molded, making the resin burrs in the sealing member 4 less likely to be generated. Therefore, the adhesion between the power module 10 and the cooler improves, suppressing inhibition of the cooling effect of the cooler due to resin burrs. As a result, quality deterioration of the power module 10 is suppressed, contributing to quality improvement of the system incorporating the power module 10.

Further, the resin burrs being suppressed from occurring suppresses breaking down of the flexible insulating member 5 due to the resin burrs, preventing the insulating property of the flexible insulating member 5 from deteriorating. This contributes to improving the quality and safety of the power module 10 and the system incorporating thereof.

Embodiment 2

FIGS. 3 and 4 are diagrams showing a configuration of a power module 10 being a semiconductor device according to Embodiment 2. FIG. 3 is a cross-sectional view of the power module 10, and FIG. 4 is a plan view of the lower surface side of the power module 10.

The power module 10 according to Embodiment 2 is provided with a plurality of projections 4b on the lower surface of the sealing member 4. In Embodiment 2, as shown in FIG. 4, the projections 4b are arranged at the four corners of the sealing member 4 having a rectangular shape in plan view. The amount of protrusion of the projection 4b from the lower surface of the sealing member 4 is smaller than the amount of protrusion of the convex portion 5a of the flexible insulating member 5 from the lower surface of the sealing member 4. That is, the convex portion 5a of the flexible insulating member 5 protrudes downward more than the projections 4b of the sealing member 4.

The other part of the power module 10 is the same as those of Embodiment 1; therefore, the description thereof is omitted here.

In Embodiment 2, the same effect as that of Embodiment 1 can also be obtained. Further, when the flexible insulating member 5 is adopted for the heat dissipation surface of the power module 10, it may cause difficulty in keeping the power module 10 horizontal when attaching the power module 10 to the cooler. However, in the power module 10 of Embodiment 2, the convex portion 5a of the sealing member 4 having the hardness higher than that of the flexible insulating member 5 serves as a stopper to determine the position of the power module 10, allowing to readily keep the power module 10 horizontal. This improves the ease of attachment of the power module 10.

The Embodiments can be combined, appropriately modified or omitted.

Hereinafter, various aspects of the present disclosure will be collectively described as Appendices.

Appendix 1

A semiconductor device comprising
a conductive die bonding portion,
a semiconductor element bonded to an upper surface of the die bonding portion,
a sealing member sealing the die bonding portion and the semiconductor element, and
a flexible insulating member bonded to a lower surface of the die bonding portion, wherein
The flexible insulating member is arranged in a recessed portion on a lower surface of the sealing member and has a convex portion protruding from the lower surface of the sealing member.

Appendix 2

The semiconductor device according to Appendix 1, wherein the lower surface of the sealing member is positioned between an upper surface and a lower surface of the flexible insulating member in cross-sectional view.

Appendix 3

The semiconductor device according to Appendix 1 or 2, wherein
the sealing member has a plurality of projections on the lower surface thereof, and
an amount of protrusion of the projections from the lower surface of the sealing member is smaller than an amount of protrusion of the convex portion of the flexible insulating member from the lower surface of the sealing member.

Appendix 4

The semiconductor device according to Appendix 3, wherein,
in plan view, the sealing member is rectangular, and the projections are arranged at four corners of the sealing member.

While the invention has been shown and described in detail, the foregoing description is in all aspects illustrative and not restrictive. It is therefore understood that numerous modifications and variations can be devised without departing from the scope of the invention.

What is claimed is:
1. A semiconductor device comprising:
a conductive die bonding portion;
a semiconductor element bonded to an upper surface of the die bonding portion;

a sealing member sealing the die bonding portion and the semiconductor element; and a flexible insulating member bonded to a lower surface of the die bonding portion, wherein the flexible insulating member has an embedded portion arranged in a recess on a lower surface of the sealing member and has a convex portion on the embedded portion protruding from the lower surface of the sealing member, wherein in a direction parallel to the lower surface of the sealing member, a width of the convex portion is smaller than a width of the embedded portion.

2. The semiconductor device according to claim 1, wherein the lower surface of the sealing member is positioned between an upper surface and a lower surface of the flexible insulating member in cross-sectional view.

3. The semiconductor device according to claim 2, wherein the sealing member has a plurality of projections on the lower surface thereof, and an amount of protrusion of the projections from the lower surface of the sealing member is smaller than an amount of protrusion of the convex portion of the flexible insulating member from the lower surface of the sealing member.

4. The semiconductor device according to claim 3, wherein, in plan view, the sealing member is rectangular, and the projections are arranged at four corners of the sealing member.

5. The semiconductor device according to claim 1, wherein the sealing member has a plurality of projections on the lower surface thereof, and an amount of protrusion of the projections from the lower surface of the sealing member is smaller than an amount of protrusion of the convex portion of the flexible insulating member from the lower surface of the sealing member.

6. The semiconductor device according to claim 5, wherein, in plan view, the sealing member is rectangular, and the projections are arranged at four corners of the sealing member.

* * * * *